(12) United States Patent
Nagatomo et al.

(10) Patent No.: US 9,807,865 B2
(45) Date of Patent: Oct. 31, 2017

(54) SUBSTRATE FOR POWER MODULES, SUBSTRATE WITH HEAT SINK FOR POWER MODULES, AND POWER MODULE

(71) Applicant: MITSUBISHI MATERIALS CORPORATION, Tokyo (JP)

(72) Inventors: Yoshiyuki Nagatomo, Saitama (JP); Nobuyuki Terasaki, Saitama (JP); Yoshirou Kuromitsu, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 121 days.

(21) Appl. No.: 14/772,155

(22) PCT Filed: Mar. 24, 2014

(86) PCT No.: PCT/JP2014/058132
§ 371 (c)(1),
(2) Date: Sep. 2, 2015

(87) PCT Pub. No.: WO2014/157112
PCT Pub. Date: Oct. 2, 2014

(65) Prior Publication Data
US 2016/0021729 A1    Jan. 21, 2016

(30) Foreign Application Priority Data

Mar. 29, 2013 (JP) ................................ 2013-072677
Oct. 17, 2013 (JP) ................................ 2013-216802

(51) Int. Cl.
*H01L 23/52* (2006.01)
*H01L 21/44* (2006.01)
(Continued)

(52) U.S. Cl.
CPC ....... *H05K 1/0203* (2013.01); *H01L 23/3735* (2013.01); *H01L 25/07* (2013.01);
(Continued)

(58) Field of Classification Search
CPC ................................................ H01L 23/3735
(Continued)

(56) References Cited

U.S. PATENT DOCUMENTS 9,076,755 B2 * 7/2015 Tonomura ........... H01L 23/3735
                                                                                 174/252
2013/0071686 A1 3/2013 Oda et al.
2015/0366048 A1 * 12/2015 Nagase ............... H01L 23/3735
                                                                                 174/252

FOREIGN PATENT DOCUMENTS

EP          2259308 A1    12/2010
JP         58-181771 A    10/1983
(Continued)

OTHER PUBLICATIONS

International Search Report mailed Jun. 10, 2014, issued for PCT/JP2014/058132 and English translation thereof.
D. M. Rabkin et al., "Preparation and Properties of Copper-Aluminum Intermetallic Compounds", Soviet Powder Metallurgy and Metal Ceramics, Aug. 1, 1970, pp. 695-700. (cited in the Oct. 5, 2016 EP Search Report).
Kwang Seok Lee et al., "Solid-state bonding between Al and Cu by vacuum hot pressing", Transactions of Nonferrous Metals Society of China, vol. 23, No. 2, Feb. 1, 2013, pp. 341-346. (cited in the Oct. 5, 2016 EP Search Report).
(Continued)

*Primary Examiner* — Calvin Lee
(74) *Attorney, Agent, or Firm* — Locke Lord LLP

(57) ABSTRACT

The present invention provides a power module substrate including an insulating substrate, a circuit layer which is formed on one surface of the insulating substrate, and a metal layer which is formed on the other surface of the insulating substrate, in which the circuit layer has a first aluminum layer made of aluminum or an aluminum alloy which is bonded to the insulating substrate and a first copper layer made of copper or a copper alloy which is bonded to the first aluminum layer by solid-phase diffusion, the metal layer has a second aluminum layer made of aluminum or an aluminum alloy, and a relationship between a thickness $t_1$ of the circuit layer and a thickness $t_2$ of the second aluminum layer of the metal layer satisfy $t_1 < t_2$.

12 Claims, 10 Drawing Sheets

(51) Int. Cl.
    *H05K 1/02*         (2006.01)
    *H01L 25/07*       (2006.01)
    *H01L 25/18*       (2006.01)
    *H01L 23/373*     (2006.01)
    *H05K 1/09*         (2006.01)
    *H05K 1/18*         (2006.01)
    *H01L 23/36*       (2006.01)
    *H01L 23/40*       (2006.01)
    *H01L 23/473*     (2006.01)

(52) U.S. Cl.
    CPC ............... *H01L 25/18* (2013.01); *H05K 1/09* (2013.01); *H05K 1/181* (2013.01); *H01L 23/36* (2013.01); *H01L 23/4006* (2013.01); *H01L 23/473* (2013.01); *H01L 2224/32225* (2013.01); *H01L 2924/13055* (2013.01); *H05K 2201/066* (2013.01)

(58) Field of Classification Search
    USPC .......... 257/675, 706, 750; 438/119–122, 652
    See application file for complete search history.

(56) References Cited

FOREIGN PATENT DOCUMENTS

| | | |
|---|---|---|
| JP | 04-162756 A | 6/1992 |
| JP | 3171234 B2 | 5/2001 |
| JP | 2002-076551 A | 3/2002 |
| JP | 2003-078086 A | 3/2003 |
| JP | 2004-001069 A | 1/2004 |
| JP | 2010-034238 A | 2/2010 |
| JP | 2012-064801 A | 3/2012 |
| WO | 2013/008865 A1 | 1/2013 |

OTHER PUBLICATIONS

Supplemental European Search Report dated Oct. 5, 2016, issued for the European patent application No. 14776236.3.
Office Action dated Aug. 29, 2017, issued for the Japanese patent application No. 2013-216802 and English translation thereof.

* cited by examiner

SUBSTRATE FOR POWER MODULES, SUBSTRATE WITH HEAT SINK FOR POWER MODULES, AND POWER MODULE

TECHNICAL FIELD

The present invention relates to a substrate for power modules which is used in a semiconductor device for controlling high current and high voltage, a substrate with a heat sink for power modules, and a power module.

Priority is claimed on Japanese Patent Application No. 2013-072677, filed Mar. 29, 2013, and Japanese Patent Application No. 2013-216802, filed Oct. 17, 2013, the contents of which are incorporated herein by reference.

BACKGROUND ART

Among semiconductor elements, power semiconductor elements for supplying power have a relatively large amount of heat generation. Therefore, as a substrate on which the power semiconductor element is mounted, a power module substrate including a circuit layer formed by bonding a first metal plate to one surface side of an insulating substrate made of, for example, AlN (aluminum nitride), $Al_2O_3$ (alumina), $Si_3N_4$ (silicon nitride) or the like, and a metal layer formed by bonding a second metal plate to the other surface side of the insulating substrate is used.

In such a power module substrate, a semiconductor element such as a power semiconductor element is mounted on the circuit layer through a solder material.

A heat sink for cooling a power module substrate is bonded to the other surface side of the metal layer.

For example, in PTL 1, a power module substrate is proposed obtained by using copper sheets used as a first metal plate and a second metal plate forming a circuit layer and a metal layer and directly bonding the copper sheets to an insulating substrate by a DBC method. In addition, as shown in a first view of PTL 1, a power module substrate with a heat sink is formed by bonding an aluminum heat sink to the power module substrate using an organic heat-resistant adhesive.

In addition, in PTL 2, a power module substrate is proposed using aluminum sheets as a first metal plate and a second metal plate forming a circuit layer and a metal layer. A power module substrate with a heat sink is formed by bonding a heat sink to the metal layer of the power module substrate by brazing.

Further, in PTL 3, a substrate is proposed in which a circuit layer is formed by bonding a metal plate to one surface of an insulating substrate and an aluminum heat sink is directly formed on the other surface of the insulating substrate by a casting method. As the metal plate forming the circuit layer, an aluminum sheet and copper sheet are used.

CITATION LIST

Patent Literature

[PTL 1] Japanese Unexamined Patent Application, First Publication No. H04-162756
[PTL 2] Japanese Patent No. 3171234
[PTL 3] Japanese Unexamined Patent Application, First Publication No. 2002-076551

SUMMARY OF INVENTION

Technical Problem

However, in the power module substrate and the power module substrate with a heat sink described in PTL 1, since a copper sheet is disposed between the aluminum heat sink and the insulating substrate, thermal strain resulting from a difference in thermal expansion coefficient between the heat sink and the insulating substrate cannot be sufficiently mitigated by the copper sheet, and thus, there is a problem in that cracking or the like is likely to occur in the insulating substrate. In PTL 1, thermal strain is mitigated by an organic heat-resistant adhesive to be interposed between the heat sink and the metal layer. However, the heat resistance is increased due to the organic heat-resistant adhesive interposed between the heat sink and the metal layer and thus, there is a problem in that heat from a heat-generating body such as an electrical component which is mounted on the circuit layer cannot be effectively dissipated to the heat sink side.

In addition, since the circuit layer and the metal layer are composed of a copper sheet having a relatively high deformation resistance, there is a concern that cracking and the like may occur in the insulating substrate due to thermal stress generated between the insulating substrate and the copper sheet during loading of a thermal cycle.

In addition, in the power module substrate and the power module substrate with a heat sink described in PTL 2, as the first metal plate forming the circuit layer, an aluminum sheet is used.

Here, the thermal conductivity of aluminum is lower than that of copper. Thus, in the case of using an aluminum sheet as the first metal plate forming the circuit layer, heat transferred from a heat-generating body such as an electrical component which is mounted on the circuit layer cannot be effectively spread and dissipated compared to the case of using a copper sheet. Accordingly, in a case in which power density increases due to a decrease in size and an increase in output of an electronic component, there is a concern that heat cannot be sufficiently dissipated. Thus, there is a concern that the durability when a power cycle is loaded can be deteriorated. In addition, since a strong oxide film is formed on the surface of the aluminum, the semiconductor element cannot be directly solder-bonded onto the circuit layer made of an aluminum sheet and Ni plating or the like has to be performed.

Further, in the power module substrate with a heat sink described in PTL 3, since the aluminum heat sink is directly bonded to the insulating substrate, cracking tends to occur in the insulating substrate due to thermal strain resulting from the difference in thermal expansion coefficient between the heat sink and the insulating substrate. In order to prevent the cracking, in PTL 3, it is required that the proof stress of the heat sink be set to be low. Therefore, the strength of the heat sink itself is not sufficient and thus the handling is very difficult.

In addition, since the heat sink is formed by a casting method, the structure of the heat sink is relatively simple and a heat sink having high cooling performance cannot be formed. Thus, there is a problem in that heat dissipation cannot be facilitated.

The present invention is made in consideration of the aforementioned circumstances and an object thereof is to provide a power module substrate capable of facilitating heat dissipation from a heat-generating body such as an electrical component which is mounted on a circuit layer, suppressing cracking occurring in an insulating substrate during loading of a thermal cycle while achieving excellent power cycle properties, and achieving high reliability, a power module substrate with a heat sink, and a power module.

Solution to Problem

According to an aspect of the present invention, a power module substrate is provided including an insulating substrate, a circuit layer which is formed on one surface of the insulating substrate, and a metal layer which is formed on the other surface of the insulating substrate, in which the circuit layer has a first aluminum layer made of aluminum or an aluminum alloy which is bonded to the insulating substrate and a first copper layer made of copper or a copper alloy which is bonded to the first aluminum layer by solid-phase diffusion, the metal layer has a second aluminum layer made of aluminum or an aluminum alloy, and a relationship between a thickness $t_1$ of the circuit layer and a thickness $t_2$ of the second aluminum layer of the metal layer satisfy $t_1 < t_2$.

In the power module substrate having this configuration, since the relationship between the thickness $t_1$ of the circuit layer having the first aluminum layer and the first copper layer which are disposed on one surface side of the insulating substrate and the thickness $t_2$ of the second aluminum layer which is disposed on the other surface side of the insulating substrate satisfies $t_1 < t_2$, the second aluminum layer of the metal layer that is formed to be relatively thick is deformed during loading of thermal stress on the power module substrate, and thus warpage occurring in the power module substrate can be suppressed.

In addition, for example, even in the case in which a heat sink is bonded to the metal layer side of the power module substrate, thermal strain resulting from a difference in thermal expansion coefficient between the insulating substrate and the heat sink can be mitigated by deformation of the second aluminum layer that is formed to be sufficiently thick.

Further, in the power module substrate of the present invention, since the circuit layer has the first aluminum layer made of aluminum or an aluminum alloy on the insulating substrate side, thermal strain resulting from a difference in thermal expansion coefficient between the insulating substrate and the circuit layer in the case of loading a heat cycle can be absorbed by deformation of the first aluminum layer and thus cracking in the insulating substrate can be suppressed.

In addition, since the circuit layer has the first copper layer made of copper or a copper alloy, heat from a semiconductor element or the like can be spread in a plane direction by the first copper layer and effective heat dissipation can be achieved. Further, a semiconductor element or the like can be solder-bonded onto the circuit layer in a satisfactory manner. Furthermore, since the first copper layer has a relatively high deformation resistance, in the case of loading of a power cycle, deformation of the surface of the circuit layer can be suppressed and thus crack initiation in the solder layer can be suppressed.

Since the first aluminum layer and the first copper layer are bonded by solid-phase diffusion, the first aluminum layer and the first copper layer are reliably bonded to each other and the thermal conductivity and electrical conductivity of the circuit layer can be maintained.

The metal layer may have the second aluminum layer which is bonded to the insulating substrate and a second copper layer made of copper or a copper alloy which is bonded to the second aluminum layer by solid-phase diffusion.

In this case, since the metal layer which is disposed on the other surface side of the insulating substrate has the second aluminum layer and the second copper layer which is bonded to the second aluminum layer by solid-phase diffusion, a heat sink is bonded to the second copper layer when the heat sink is bonded to the metal layer side of the power module substrate.

For example, in the case in which the bonding surface of a heat sink is composed of aluminum or an aluminum alloy, the second copper layer and the heat sink can be bonded by solid-phase diffusion. In addition, for example, in the case in which the bonding surface of the heat sink is composed of copper or a copper alloy, the second copper layer and the heat sink can be bonded using solder.

Since the metal layer includes the second copper layer made of copper or a copper alloy, heat can be spread in a plane direction by the second copper layer and effective heat dissipation can be achieved.

Further, since the second aluminum layer having a relatively low deformation resistance is formed between the insulating substrate and the second copper layer, thermal stress is mitigated by deformation of the second aluminum layer and thus cracking occurring in the insulating substrate can be suppressed.

Since the second aluminum layer and the second copper layer are bonded by solid-phase diffusion, the second aluminum layer and the second copper layer are reliably bonded and thus the thermal conductivity of the metal layer can be maintained.

It is preferable that the relationship between thickness $t_1$ of the circuit layer and the thickness $t_2$ of the second aluminum layer of the metal layer satisfy $t_2/t_1 \geq 1.5$.

In this case, since the relationship between thickness $t_1$ of the circuit layer and the thickness $t_2$ of the second aluminum layer of the metal layer satisfies $t_2/t_1 \geq 1.5$, warpage occurring in the substrate for power modules can be reliably suppressed.

According to another aspect of the present invention, a power module substrate with a heat sink is provided, including the power module substrate and a heat sink which is bonded to the metal layer side.

According to the power module substrate with a heat sink having this configuration, the metal layer having the second aluminum layer made of aluminum or an aluminum alloy is interposed between the heat sink and the insulating substrate, and the relationship between the thickness $t_2$ of the second aluminum layer to the thickness $t_1$ of the circuit layer satisfies $t_1 < t_2$. Accordingly, thermal strain resulting from a difference in thermal expansion coefficient between the insulating substrate and the heat sink can be mitigated by deformation of the second aluminum layer of the metal layer. Thus, cracking occurring in the insulating substrate can be suppressed.

According to still another aspect of the present invention, a power module is provided, including the power module substrate and an electrical component which is mounted on the circuit layer.

According to the power module having this configuration, even in the case in which heat from an electrical component which is mounted on the circuit layer can be effectively dissipated and the power density (amount of heat generation) of the electrical component is improved, it is possible to sufficiently cope with this situation. Further, the durability during loading of a power cycle can be improved.

Advantageous Effects of Invention

According to the present invention, it is possible to provide a power module substrate capable of facilitating heat dissipation from a heat-generating body such as an electrical component which is mounted on a circuit layer, suppressing cracking occurring in an insulating substrate during loading of a thermal cycle while achieving excellent power cycle properties, and achieving high reliability, a power module substrate with a heat sink, and a power module.

DESCRIPTION OF EMBODIMENTS

Hereinafter, embodiments of the present invention will be described with reference to the attached drawings.

Figure 1:
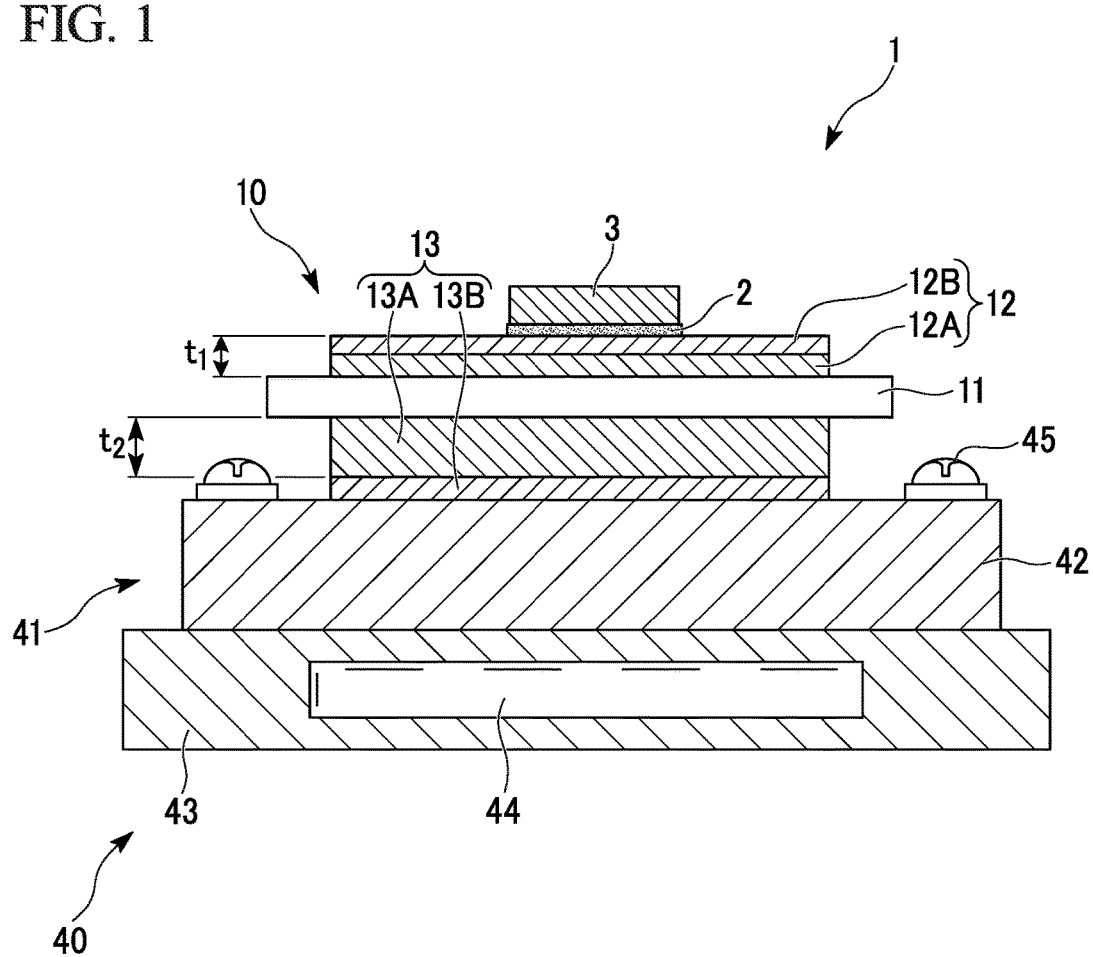
FIG. 1 is a schematic explanatory diagram showing a power module using a power module substrate according to a first embodiment of the present invention.

FIG. 1 shows a power module substrate 10, a power module substrate with a heat sink 40, and a power module 1 according to a first embodiment of the present invention.

The power module 1 includes the power module substrate with a heat sink 40, and a semiconductor element (an electrical component) 3 which is bonded to one surface side (upper side in FIG. 1) of the power module substrate with a heat sink 40 through a solder layer 2.

Here, the solder layer 2 is composed of, for example, a Sn—Ag-based solder material, a Sn—In-based solder material, or a Sn—Ag—Cu-based solder material.

The power module substrate with a heat sink 40 includes the power module substrate 10 and a heat sink 41 for cooling the power module substrate 10.

The heat sink 41 in the embodiment includes a top plate portion 42 which is bonded with the power module substrate 10, and a cooling member 43 which is laminated on the top plate portion 42. Inside the cooling member 43, a flow passage 44 in which a cooling medium flows is formed.

Here, the top plate portion 42 is connected with the cooling member 43 by fixing screws 45. Therefore, the top plate portion 42 requires sufficient rigidity that is not easily deformed upon screwing the fixing screws 45. Accordingly, in the embodiment, the top plate portion 42 of the heat sink 41 is formed from a metal material having a proof stress of 100 N/mm$^2$ or more, and the thickness of the top plate portion 42 is 2 mm or more. In the embodiment, the top plate portion 42 is composed of A6063 alloy (aluminum alloy).

The power module substrate 10 includes an insulating substrate 11, a circuit layer 12 disposed on one surface (upper surface in FIG. 1) of this insulating substrate 11, and a metal layer 13 disposed on the other surface (lower surface in FIG. 1) of the insulating substrate 11.

The insulating substrate 11 prevents electrical connection between the circuit layer 12 and the metal layer 13, and is composed, for example, of a ceramic having a high degree of insulating properties such as AlN (aluminum nitride), $Si_3N_4$ (silicon nitride) or $Al_2O_3$ (alumina). In the embodiment, the insulating substrate 11 is composed of AlN (aluminum nitride). Further, the thickness of the insulating substrate 11 is set to be within a range of 0.2 mm or more and 1.5 mm or less, and is set to 0.635 mm in the embodiment.

As shown in FIG. 1, the circuit layer 12 has a first aluminum layer 12A which is disposed on one surface (upper surface in FIG. 1) of the insulating substrate 11 and a first copper layer 12B which is bonded to one surface side of the first aluminum layer 12A.

In the embodiment, the first aluminum layer 12A is formed by bonding a rolled plate of aluminum (so-called 4N aluminum) having a purity of 99.99% by mass or more to one surface of the insulating substrate 11.

In addition, the first copper layer 12B is formed by bonding a rolled plate of oxygen-free copper to the first aluminum layer 12A by solid-phase diffusion.

As shown in FIG. 1, the metal layer 13 has a second aluminum layer 13A which is disposed on the other surface (lower surface in FIG. 1) of the insulating substrate 11 and a second copper layer 13B which is disposed on the other side (lower side in FIG. 1) of the second aluminum layer 13A.

In the embodiment, the second aluminum layer 13A is formed by bonding a rolled plate of aluminum (so-called 4N aluminum) having a purity of 99.99% by mass or more to the other surface of the insulating substrate 11.

Further, the second copper layer 13B is formed by bonding a rolled plate of oxygen-free copper to the second aluminum layer 13A by solid-phase diffusion.

As described above, in the embodiment, the circuit layer 12 and the metal layer 13 are respectively composed of a bonded body obtained by bonding an aluminum layer (first aluminum layer 12A and second aluminum layer 13A) to a copper layer (first copper layer 12B and second copper layer 13B).

Figure 2:
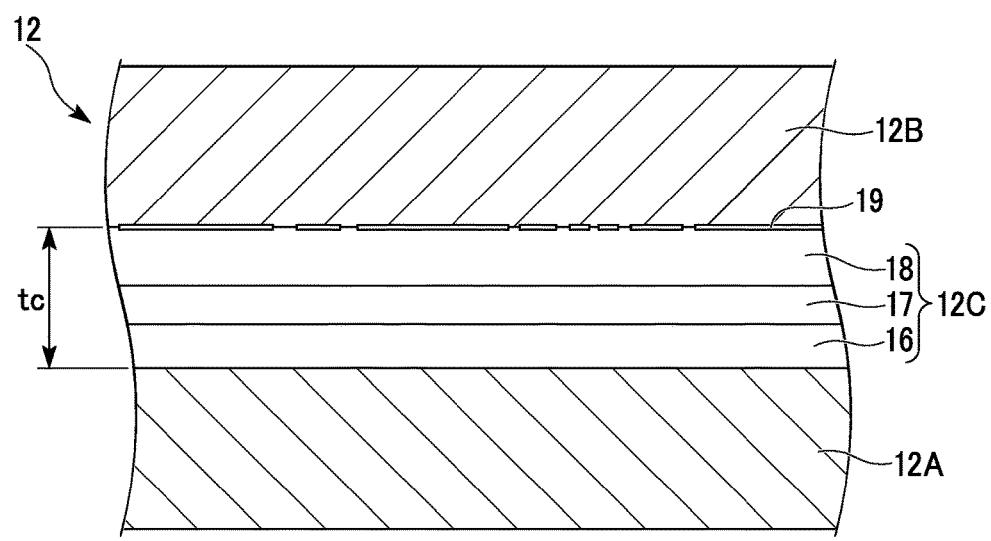
FIG. 2 is an enlarged explanatory diagram showing a bonding interface between a first aluminum layer and a first copper layer in a circuit layer in FIG. 1.
Figure 3:
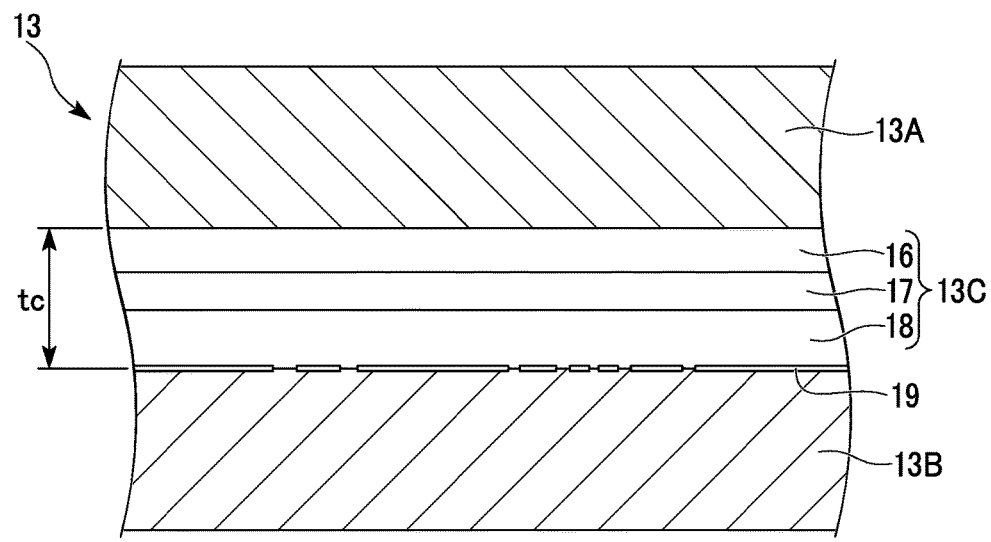
FIG. 3 is an enlarged explanatory diagram showing a bonding interface between a second aluminum layer and a second copper layer in a metal layer in FIG. 1.

Here, as shown in FIGS. 2 and 3, an intermetallic compound layer (first intermetallic compound layer 12C and second intermetallic compound layer 13C) is formed respectively at the bonding interface at which the first aluminum layer 12A and the first copper layer 12B are bonded by solid-phase diffusion and at the bonding interface at which the second aluminum layer 13A and the second copper layer 13B are bonded by solid-phase diffusion.

The intermetallic compound layer (first intermetallic compound layer 12C and second intermetallic compound layer 13C) is formed by mutual diffusion of aluminum atoms of the aluminum layer (first aluminum layer 12A and second aluminum layer 13A) and copper atoms of the copper layer (first copper layer 12B and second copper layer 13B) and a concentration gradient in which the aluminum atom concentration decreases gradually and the copper atom concentration increases from the aluminum layer (first aluminum layer 12A and second aluminum layer 13A) to the copper layer (first copper layer 12B and second copper layer 13B) is formed. Here, the thickness $t_C$ of the intermetallic compound layer (first intermetallic compound layer 12C and second intermetallic compound layer 13C) is set to be within a range of 1 μm or more and 80 μm or less, preferably within a range of 5 μm or more and 80 μm or less.

The intermetallic compound layer (first intermetallic compound layer 12C and second intermetallic compound layer 13C) is composed of an intermetallic compound of Cu and Al and in the embodiment, a plurality of intermetallic compounds are laminated along the bonding interface.

Figure 13:
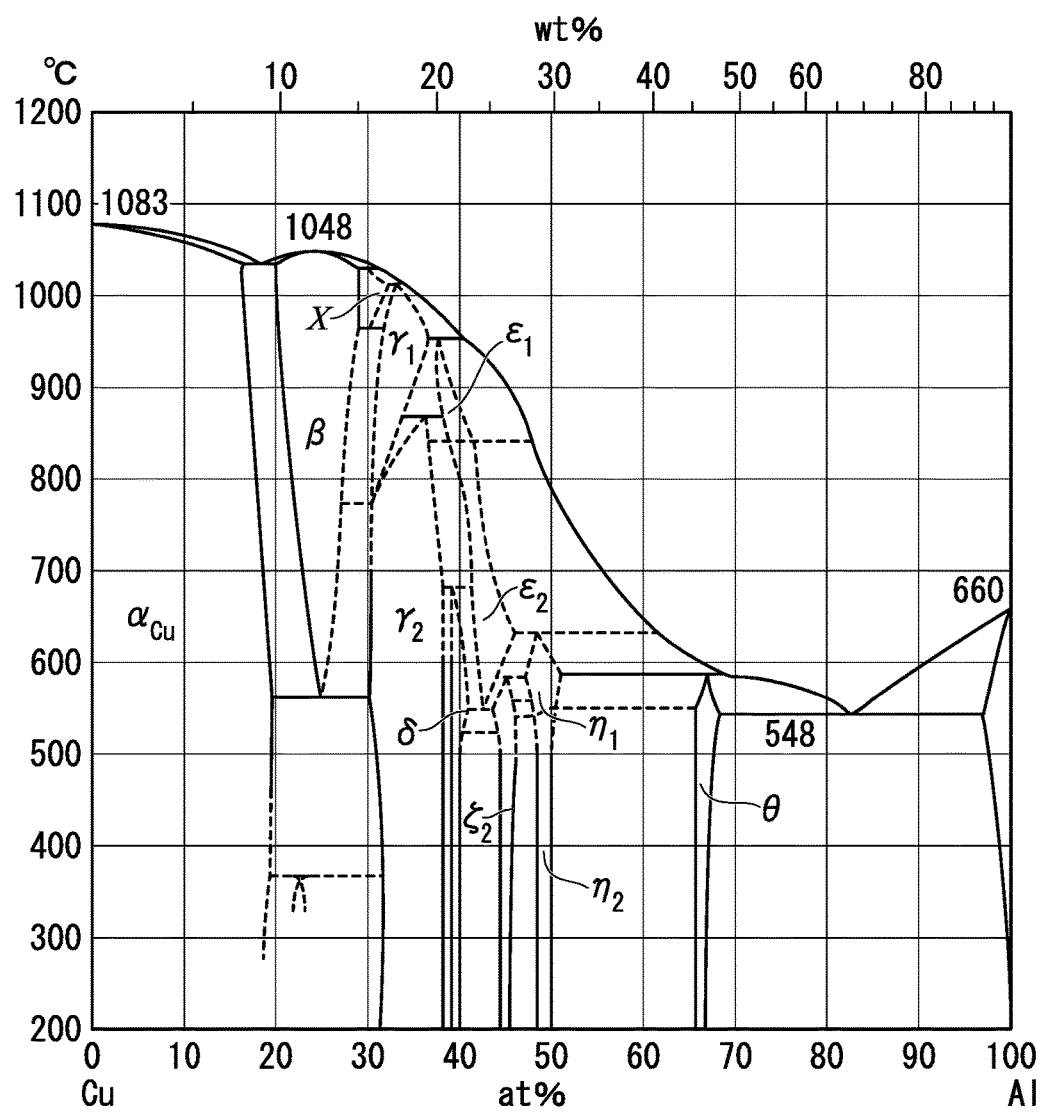
FIG. 13 is a binary phase diagram of Cu and Al.

In the embodiment, as shown in FIGS. 2 and 3, the intermetallic compound layer has a structure in which three kinds of intermetallic compounds are laminated and a θ phase 16, a η2 phase 17, and a ζ2 phase 18 are arranged in order from the aluminum layer (first aluminum layer 12A and second aluminum layer 13A) to the copper layer (first copper layer 12B and second copper layer 13B) (refer to FIG. 13).

In addition, at the bonding interface between the intermetallic compound layer (first intermetallic compound layer 12C and second intermetallic compound layer 13C) and the copper layer (first copper layer 12B and second copper layer 13B), oxides 19 are dispersed in the form of a layer along the bonding interface. In the embodiment, the oxide 19 is an aluminum oxide such as alumina ($Al_2O_3$). The oxides 19 are dispersed in a state of being divided in the interfaces between the intermetallic compound layer (first intermetallic compound layer 12C and second intermetallic compound layer 13C) and the copper layer (first copper layer 12B and second copper layer 13B), and the first intermetallic compound layer 12C and the first copper layer 12B are directly in contact in some regions.

Further, in the embodiment, the average crystal grain size of the copper layer (first copper layer 12B and second copper layer 13B) is set to be within a range of 50 μm or more and 200 μm or less and the average crystal grain size of the aluminum layer (first aluminum layer 12A and second aluminum layer 13A) is set to 500 μm or more.

Here, as shown in FIG. 1, the relationship between the thickness $t_1$ of the circuit layer 12 and the thickness $t_2$ of the second aluminum layer 13A of the metal layer 13 satisfies $t_1 < t_2$.

In the embodiment, the thickness $t_1$ of the circuit layer 12 is set to be within a range of 0.10 mm $t_1 \leq 3.6$ mm and the thickness $t_2$ of the second aluminum layer 13A of the metal layer 13 is set to be within a range of 0.15 mm$\leq t_2 \leq 5.4$ mm. The relationship between the thickness $t_1$ of the circuit layer 12 and the thickness $t_2$ of the second aluminum layer 13A of the metal layer 13 satisfies $t_2/t_1 \geq 1.5$.

Figure 4:
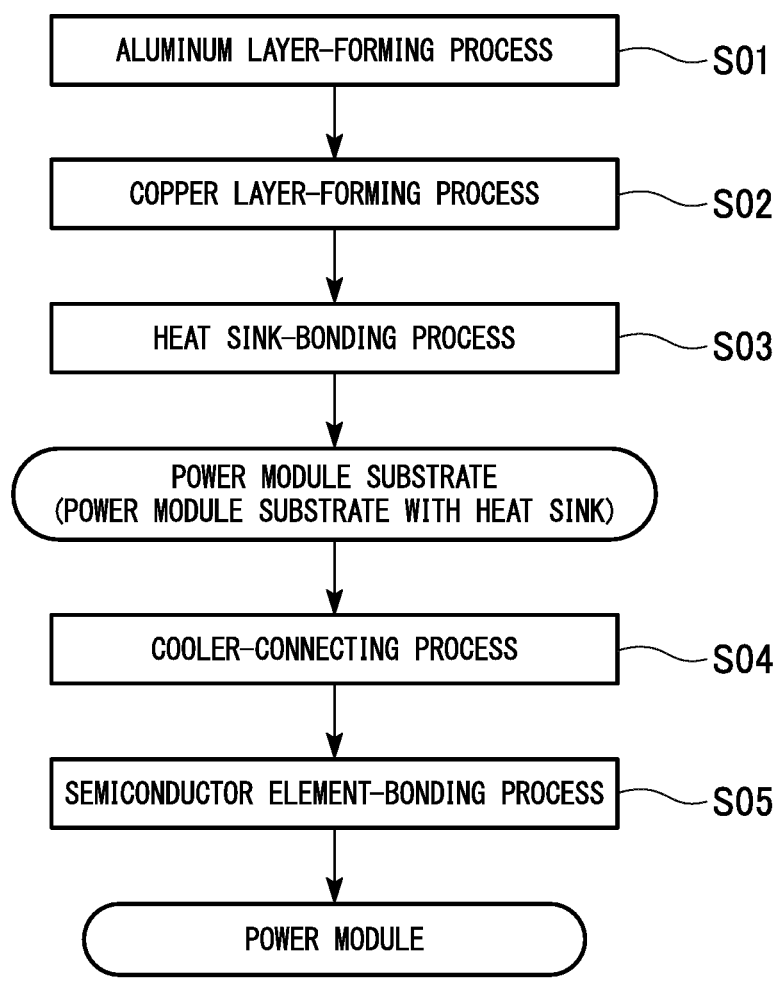
FIG. 4 is a flow diagram showing a method of producing the power module substrate and the power module substrate with a heat sink according to the first embodiment of the present invention.

Hereinafter, a method of producing the power module substrate 10 having the aforementioned configuration and the power module substrate with a heat sink 40 will be described with reference to FIGS. 4 and 5.

Figure 5:
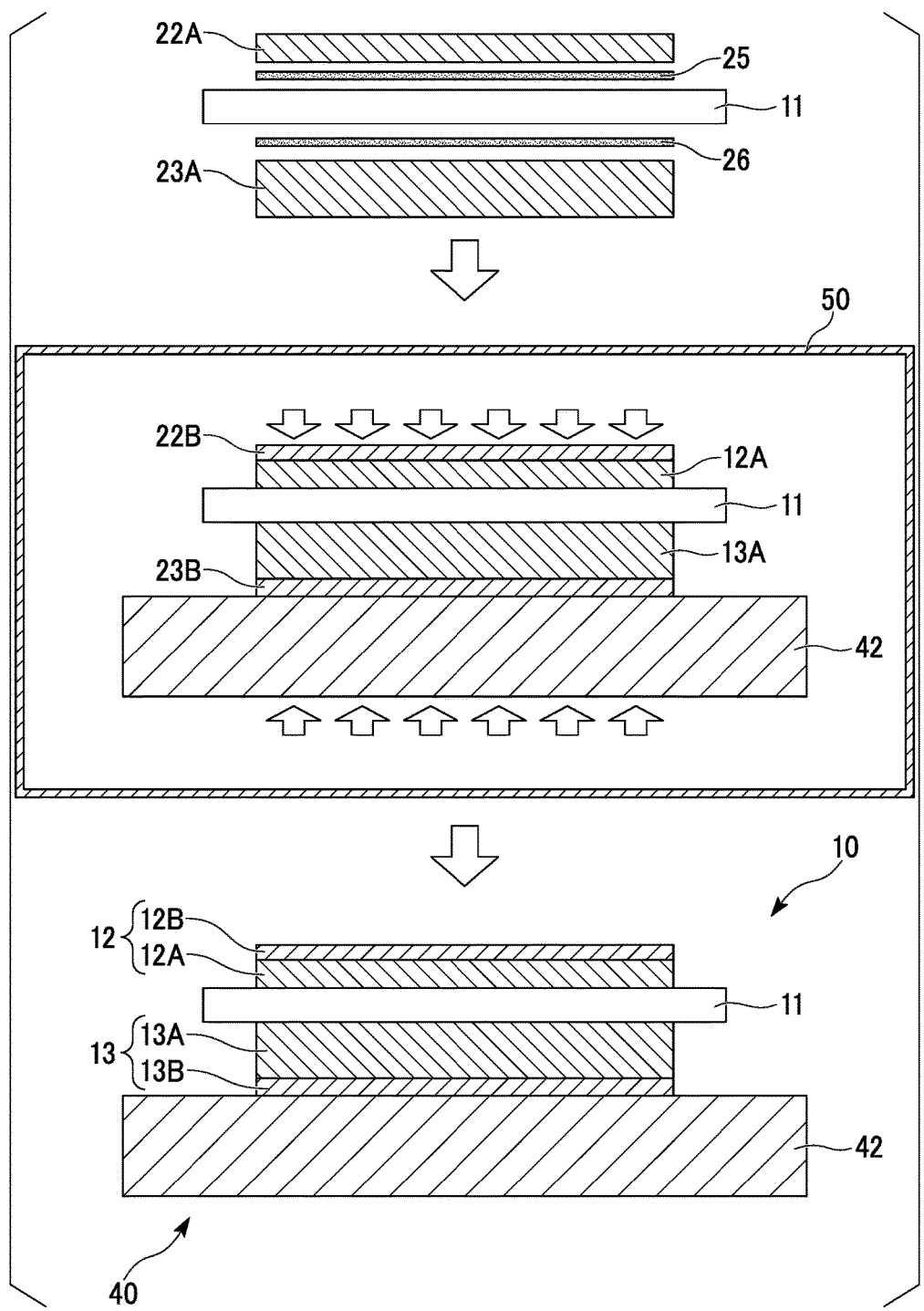
FIG. 5 is an explanatory diagram showing a method of producing the power module substrate and the power module substrate with a heat sink according to the first embodiment of the present invention.

First, as shown in FIG. 5, the first aluminum sheet 22A and the second aluminum sheet 23A are laminated on one surface (upper surface in FIG. 5) and the other surface (lower surface in FIG. 5) of the insulating substrate 11 through Al—Si-based brazing materials 25 and 26. Then, the insulating substrate 11, the first aluminum sheet 22A, and the second aluminum sheet 23A are bonded by compression, heating, and then cooling to form the first aluminum layer 12A and the second aluminum layer 13A on the insulating substrate 11 (aluminum layer-forming process S01). The brazing temperature is set to, for example, 640° C. to 650° C.

Next, a first copper sheet 22B is disposed on one side of the first aluminum layer 12A (upper side in FIG. 5). In addition, the top plate portion 42 of the heat sink 41 is laminated on the other side (lower side in FIG. 5) of the second aluminum layer 13A through the second copper sheet 23B. Then, this laminated body is put into a vacuum heating furnace 50 and heating treatment is performed in a vacuum atmosphere while being compressed in a lamination direction (at a pressure of 3 kgf/cm² or more and 35 kgf/cm² or less). In the embodiment, the heating temperature is set to, for example, 400° C. or higher and lower than 548° C. and the holding time is set to, for example, 5 minutes or more and 240 minutes or less. The heating temperature is preferably set to be within a range of a temperature 5° C. lower than the eutectic temperature of Al and Cu and a temperature lower than the eutectic temperature. Further, it is preferable that flaws be removed from the bonding surface to be bonded by solid-phase diffusion in advance to obtain a smooth surface.

Accordingly, the first copper layer 12B bonded to the first aluminum layer 12A by solid-phase diffusion and the second copper layer 13B bonded to the second aluminum layer 13A by solid-phase diffusion are formed (copper layer-forming process S02). Further, the second copper layer 13B and the top plate portion 42 are bonded by solid-phase diffusion (heat sink-bonding process S03).

Next, the cooling member 43 is laminated on the other side of the top plate portion 42 using grease and the top plate portion 42 is connected with the cooling member 43 by the fixing screws 45 (cooler connecting process S04).

Then, the semiconductor element 3 is bonded to one surface of the circuit layer 12 by soldering (semiconductor element-bonding process S05).

In this manner, the power module substrate 10, the power module substrate with a heat sink 40 and the power module 1 according to the embodiment are produced.

According to the power module substrate 10 having the above-described configuration of the embodiment, since the relationship between the thickness $t_1$ of the circuit layer 12 disposed on one surface side of the insulating substrate 11 and the thickness $t_2$ of the second aluminum layer 13A of the metal layer 13 disposed on the other surface side of the insulating substrate 11 satisfies $t_1 < t_2$, the second aluminum layer 13A of the metal layer 13 which is formed to be relatively thick when thermal stress is loaded on the power module substrate 10 is deformed and thus warpage occurring in the power module substrate 10 can be suppressed.

Particularly, in the embodiment, since the relationship between the thickness $t_1$ of the circuit layer 12 and the thickness $t_2$ of the second aluminum layer 13A of the metal layer 13 satisfies $t_2/t_1 \geq 1.5$, warpage occurring in the power module substrate 10 can be reliably suppressed.

In addition, in the embodiment, since the circuit layer 12 includes the first aluminum layer 12A on the insulating substrate 11, thermal stress resulting from a difference in thermal expansion coefficient between the insulating substrate 11 and the circuit layer 12 in the case in which a heat cycle is loaded is absorbed by deformation of the first aluminum layer 12A. Thus, cracking in the insulating substrate 11 can be suppressed. Particularly, in the embodiment, since the first aluminum layer 12A is formed by bonding a rolled plate of 4N aluminum having a purity of 99.99% by mass or more, deformation resistance is low and thermal stress is absorbed by the aluminum layer. Thus, cracking in the insulating substrate 11 can be reliably suppressed.

Further, since the circuit layer 12 includes the first copper layer 12B, heat from the semiconductor element 3 can be spread by the first copper layer 12B in a plane direction and thus effective heat dissipation can be achieved.

In addition, the semiconductor element 3 can be bonded to the circuit layer 12 (first copper layer 12B) in a satisfactory manner. Further, since the first copper layer 12B has a relatively high deformation resistance, in the case in which a power cycle is loaded, the surface deformation of the circuit layer 12 can be suppressed and cracks initiated in the solder layer 2 can be suppressed. Particularly, in the embodiment, since the first copper layer 12B is formed by bonding a rolled plate of oxygen-free copper, thermal conductivity is excellent and heat dissipation properties can be reliably improved.

Since the first aluminum layer 12A and the first copper layer 12B are bonded by solid-phase diffusion, the first aluminum layer 12A and the first copper layer 12B are reliably bonded and the thermal conductivity and electrical conductivity of the circuit layer 12 can be maintained.

In addition, since the metal layer 13 has the second aluminum layer 13A which is bonded to the insulating substrate 11 and the second copper layer 13B which is bonded to the second aluminum layer 13A by solid-phase diffusion, the thermal stress loaded on the power module substrate 10 is mitigated by deformation of the second aluminum layer 13A and thus cracking occurring in the insulating substrate 11 can be suppressed. Further, since heat is spread by the second copper layer 13B in the plane direction, heat dissipation properties can be improved. Since the second aluminum layer 13A and the second copper layer 13B are bonded by solid-phase diffusion, the second aluminum layer 13A and the second copper layer 13B are reliably bonded and the thermal conductivity of the metal layer 13 can be maintained.

In the embodiment, the intermetallic compound layer (first intermetallic compound layer 12C and second intermetallic compound layer 13C) is formed between the aluminum layer (first aluminum layer 12A and second aluminum layer 13A) and the copper layer (first copper layer 12B and second copper layer 13B). Therefore, Al in the aluminum layer (first aluminum layer 12A and second aluminum layer 13A) diffuses into the copper layer (first copper layer 12B and second copper layer 13B) and Cu in the copper layer (first copper layer 12B and second copper layer 13B) diffuses into the aluminum layer (first aluminum layer 12A and second aluminum layer 13A) in a sufficiently mutual manner. Thus, the aluminum layer (first aluminum layer 12A and second aluminum layer 13A) and the copper layer (first copper layer 12B and second copper layer 13B) are reliably bonded and bonding reliability is excellent.

In addition, in the embodiment, the oxides 19 are dispersed at the bonding interface between the copper layer (first copper layer 12B and second copper layer 13B) and the intermetallic compound layer (first intermetallic compound layer 12C and second intermetallic compound layer 13C) in the form of a layer along the bonding interface. Therefore, an oxide film that is formed on the surface of the aluminum layer (first aluminum layer 12A and second aluminum layer 13A) is reliably fractured and the mutual diffusion between Cu and Al progresses sufficiently. Thus, the aluminum layer (first aluminum layer 12A and second aluminum layer 13A) and the copper layer (first copper layer 12B and second copper layer 13B) are reliably bonded and there is no concern of peeling occurring between the circuit layer 12 and the metal layer 13.

In the embodiment, since the intermetallic compound layer (first intermetallic compound layer 12C and second intermetallic compound layer 13C) has a structure in which a plurality of intermetallic compounds are laminated along the bonding interface, brittle intermetallic compounds can be prevented from growing greatly.

In addition, in the embodiment, since the intermetallic compounds of θ phase 16, η2 phase 17, and ζ2 phase 18 are arranged in order the from aluminum layer (first aluminum layer 12A and second aluminum layer 13A) to the copper layer (first copper layer 12B and second copper layer 13B), a volume change in the intermetallic compound layer (first intermetallic compound layer 12C and second intermetallic compound layer 13C) is reduced and internal strain can be suppressed.

That is, when solid-phase diffusion is not carried out, for example, a liquid phase is formed, more intermetallic compounds than necessary are formed, and the volume change in the intermetallic compound layer is increased. Thus, internal strain is generated in the intermetallic compound layer. However, when solid-phase diffusion is carried out, a brittle intermetallic compound layer does not greatly grow and the intermetallic compounds are formed in the form of a layer. Thus, the internal strain is suppressed.

Further, Cu in the copper layer (first copper layer 12B and second copper layer 13B) and Al in the aluminum layer (first aluminum layer 12A and second aluminum layer 13A) mutually diffuse into the aluminum layer and the copper layer and thus intermetallic compounds suitable for the respective compositions are formed in the form of a layer from the copper layer (first copper layer 12B and second copper layer 13B) to the aluminum layer (first aluminum layer 12A and second aluminum layer 13A). Therefore, the properties of the bonding interface can be stabilized.

In addition, in the embodiment, the average crystal grain size of the aluminum layer (first aluminum layer 12A and second aluminum layer 13A) is set to 500 μm or more and the average crystal grain size of the copper layer (first copper layer 12B and second copper layer 13B) is set to be within a range of 50 μm or more and 200 μm or less. Thus, excessive strain is not accumulated in the aluminum layer (first aluminum layer 12A and second aluminum layer 13A) and fatigue properties are improved. Accordingly, the reliability with respect to thermal stress generated in the power module substrate 10 during loading of a thermal cycle is improved.

Further, in the embodiment, the thickness $t_C$ of the intermetallic compound layer (first intermetallic compound layer 12C and second intermetallic compound layer 13C) is set to be within a range of 1 μm or more and 80 μm or less and preferably within a range of 5 μm or more and 80 μm or less. Accordingly, mutual diffusion of Cu and Al progresses sufficiently and the copper layer (first copper layer 12B and second copper layer 13B) and the aluminum layer (first aluminum layer 12A and second aluminum layer 13A) can be bonded firmly. Thus, more brittle intermetallic compounds than necessary can be prevented from growing and the properties of the bonding interface become stable.

In the power module substrate with a heat sink 40 of the embodiment, the metal layer 13 having the second aluminum layer 13A is interposed between the top plate portion 42 of the heat sink 41 and the insulating substrate 11 and the relationship between the thickness $t_2$ of the second aluminum layer 13A and the thickness $t_1$ of the circuit layer 12 satisfies $t_1 < t_2$. Accordingly, thermal strain resulting from the difference in thermal expansion coefficient between the insulating substrate 11 and the heat sink 41 can be mitigated by deformation of the second aluminum layer 13A of the metal layer 13 and cracking in the insulating substrate 11 can be suppressed.

Further, in the embodiment, since the metal layer 13 has the second copper layer 13B and the second copper layer 13B and the top plate portion 42 of the heat sink 41 are bonded by solid-phase diffusion, heat from the power module substrate 10 can be effectively transferred to the heat sink 41 and heat dissipation properties can be significantly improved.

According to the power module 1 of the embodiment, heat from the semiconductor element 3 which is mounted on the circuit layer 12 can be effectively dissipated. Therefore, even when the power density (the amount of heat generation) of the semiconductor element 3 is improved, it is possible to sufficiently cope with this situation. Further, the durability during loading of a power cycle can be improved.

Next, the second embodiment will be described with reference to FIG. 6.

Figure 6:
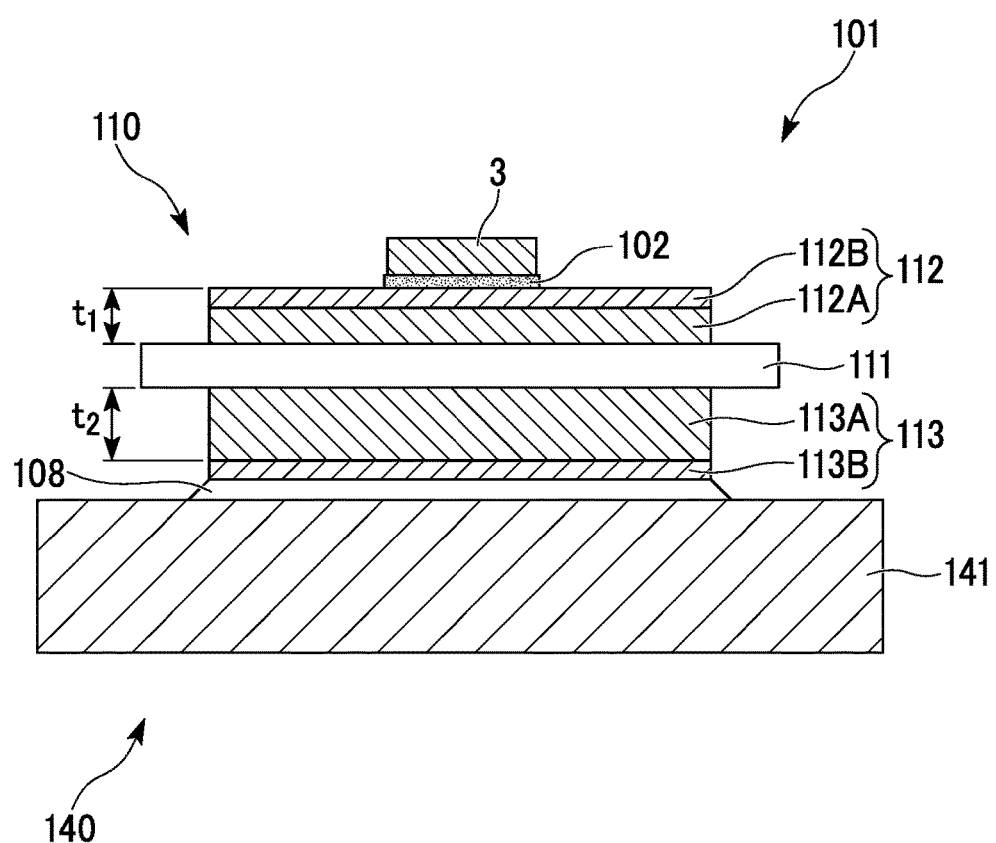
FIG. 6 is a schematic explanatory diagram showing a power module using a power module substrate with a heat sink according to a second embodiment of the present invention.

A power module 101 shown in FIG. 6 includes a power module substrate with a heat sink 140, and a semiconductor element (electrical component) 3 which is bonded to one surface side (upper side in FIG. 6) of the power module substrate with the heat sink 140 through a first solder layer 102. Here, for example, the first solder layer 102 is composed of a Sn—Ag-based solder material, a Sn—In-based solder material, a Sn—Sb-based solder material, or a Sn—Ag—Cu-based solder material.

The power module substrate with a heat sink 140 includes the power module substrate 110 and a heat sink 141 for cooling the power module substrate 110.

The power module substrate 110 includes an insulating substrate 111, a circuit layer 112 which is disposed on one surface (upper surface in FIG. 6) of the insulating substrate 111, and a metal layer 113 which is disposed on the other surface (lower surface in FIG. 6) of the insulating substrate 111.

In the embodiment, the insulating substrate 111 is composed of AlN (aluminum nitride). In addition, for example, the thickness of the insulating substrate 111 is set to be within a range of 0.2 mm or more and 1.5 mm or less and is set to 0.635 mm in the embodiment.

As shown in FIG. 6, the circuit layer 112 has a first aluminum layer 112A which is disposed on one surface (upper surface in FIG. 6) of the insulating substrate 111 and a first copper layer 112B which is disposed on one surface side of the first aluminum layer 112A.

In the embodiment, the first aluminum layer 112A is formed by bonding a rolled plate of aluminum (so-called 4N aluminum) having a purity of 99.99% by mass or more to one surface of the insulating substrate 111.

In addition, the first copper layer 112B is formed by bonding a rolled plate of oxygen-free copper to the first aluminum layer 112A by solid-phase diffusion.

As shown in FIG. 1, the metal layer 113 has a second aluminum layer 113A which is disposed on the other surface (lower surface in FIG. 6) of the insulating substrate 111 and a second copper layer 113B which is bonded to the other surface side (lower side in FIG. 6) of the second aluminum layer 113A.

In the embodiment, the second aluminum layer 113A is formed by bonding a rolled plate of aluminum (so-called 4N aluminum) having a purity of 99.99% by mass or more to the other surface of the insulating substrate 111.

In addition, the second copper layer 113B is formed by bonding a rolled plate of oxygen-free copper to the second aluminum layer 113A by solid-phase diffusion.

As described above, in the embodiment, similar to the first embodiment, the circuit layer 112 and the metal layer 113 are respectively composed of a bonding body formed by diffusion bonding of an aluminum layer (first aluminum layer 112A and second aluminum layer 113A) and a copper layer (first copper layer 112B and second copper layer 113B).

In the power module substrate 110 of the embodiment, the relationship between the thickness $t_1$ of the circuit layer 112 and the thickness $t_2$ of the second aluminum layer 113A of the metal layer 113 satisfies $t_1 < t_2$.

In the embodiment, the thickness $t_1$ of the circuit layer 112 is set to be within a range of 0.1 mm$\leq t_1 \leq$3.6 mm and the thickness $t_2$ of the second aluminum layer 113A of the metal layer 113 is set to be within a range of 0.15 mm$\leq t_2 \leq$5.4 mm. The relationship between the thickness $t_1$ of the circuit layer 112 and the thickness $t_2$ of the second aluminum layer 113A of the metal layer 113 satisfies $t_2/t_1 \geq 1.5$.

In addition, in the embodiment, the heat sink 141 is formed from a heat-dissipating plate made of copper or a copper alloy.

The heat sink 141 is bonded to the metal layer 113 of the power module substrate 110 through a second solder layer 108. In addition, the second solder layer 108 can be formed by using a Sn—Ag-based solder material, a Sn—In-based solder material, a Sn—Sb-based solder material, or a Sn—Ag—Cu-based solder material similar to the aforementioned the first solder layer 102.

In the power module substrate with a heat sink 140 having the above-described configuration of the embodiment, similar to the first embodiment, cracking in the insulating substrate 111, warpage in the power module substrate 110, and the like can be suppressed.

Further, in the embodiment, since the metal layer 113 has the second copper layer 113B, the heat sink 141 made of copper or a copper alloy can be bonded to the metal layer through the solder layer 108.

Further, since the circuit layer 112 has the first copper layer 112B and the metal layer 113 has the second copper layer 113B, the rigidity of the entire power module substrate 110 is ensured. Thus, the power module substrate 110 is less likely to be deformed during loading of a heating cycle and crack initiation in the second solder layer 108 can be suppressed.

Next, a third embodiment of the present invention will be described with reference to FIG. 7.

Figure 7:
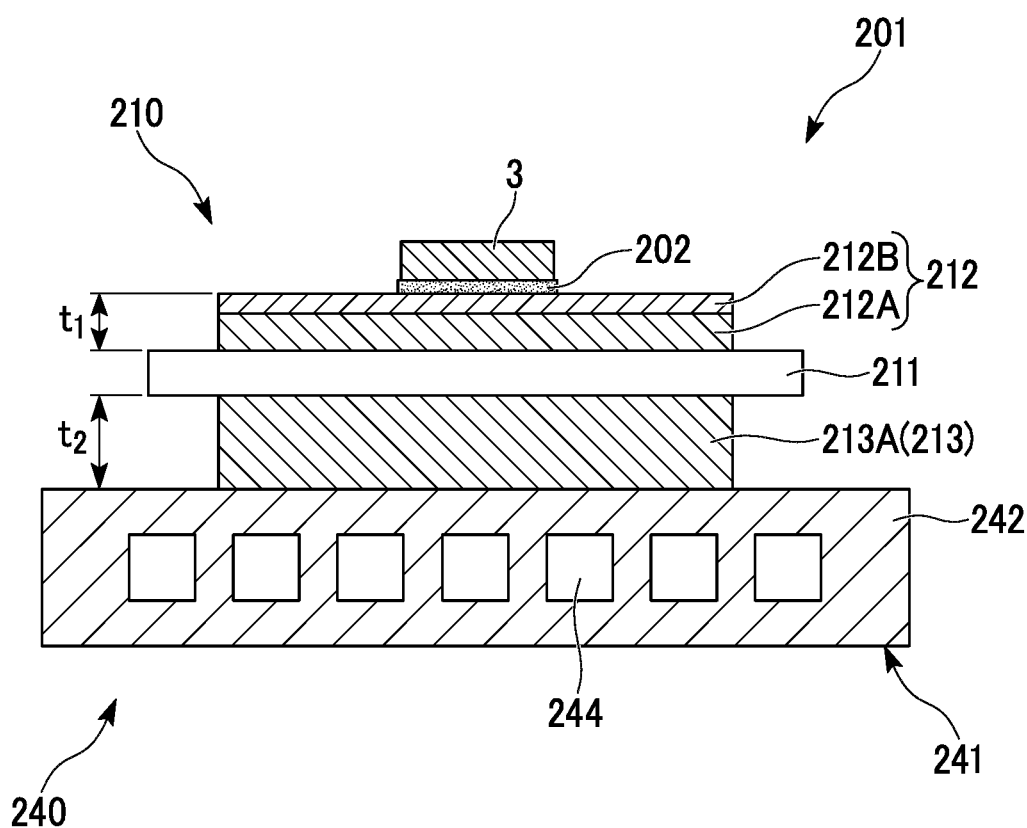
FIG. 7 is a schematic explanatory diagram showing a power module using a power module substrate according to a third embodiment of the present invention.

A power module 201 shown in FIG. 7 includes a power module substrate with a heat sink 240, and a semiconductor element (electrical component) 3 which is bonded to one surface side (upper side in FIG. 7) of the power module substrate with a heat sink 240 through a solder layer 202.

Here, for example, the solder layer 202 is composed of a Sn—Ag-based solder material, a Sn—In-based solder material, or a Sn—Ag—Cu-based solder material.

The power module substrate with the heat sink 240 includes a power module substrate 210 and a heat sink 241 for cooling the power module substrate 210.

The power module substrate 210 includes an insulating substrate 211, a circuit layer 212 which is disposed on one surface (upper surface in FIG. 7) of the insulating substrate 211, and a metal layer 213 which is disposed on the other surface (lower surface in FIG. 7) of the insulating substrate 211.

In the embodiment, the insulating substrate 211 is composed of AlN (aluminum nitride). Further, for example, the thickness of the insulating substrate 211 is set to be within a range of 0.2 mm or more and 1.5 mm or less and is 0.635 mm in the embodiment.

As shown in FIG. 7, the circuit layer 212 has a first aluminum layer 212A which is disposed on one surface (upper surface in FIG. 7) of the insulating substrate 211 and a first copper layer 212B which is bonded to one surface side of the first aluminum layer 212A.

In the embodiment, the first aluminum layer 212A is formed by bonding a rolled plate of aluminum (so-called 4N aluminum) having a purity of 99.99% by mass or more to one surface of the insulating substrate 211. In addition, the first copper layer 212B is formed by bonding a rolled plate of oxygen-free copper to the first aluminum layer 212A by solid-phase diffusion.

As shown in FIG. 7, the metal layer 213 is composed of a second aluminum layer 213A which is disposed on the other surface (lower surface in FIG. 7) of the insulating substrate 211.

In the embodiment, the metal layer 213 (second aluminum layer 213A) is formed by bonding a rolled plate of aluminum (so-called 4N aluminum) having a purity of 99.99% by mass or more to the other surface of the insulating substrate 211.

In the power module substrate 210 of the embodiment, the relationship between the thickness $t_1$ of the circuit layer 212 and the thickness $t_2$ of the second aluminum layer 213A of the metal layer 213 satisfies $t_1 < t_2$.

In the embodiment, the thickness $t_1$ of the circuit layer 212 is set to be within a range of 0.1 mm $\leq t_1 \leq$ 3.6 mm and the thickness $t_2$ of the metal layer 213 (second aluminum layer 213A) is set to be within a range of 0.15 mm $\leq t_2 \leq$ 15.4 mm. The relationship between the thickness $t_1$ of the circuit layer 212 and the thickness $t_2$ of the metal layer 213 (second aluminum layer 213A) satisfies $t_2/t_1 \geq 1.5$.

The heat sink 241 in the embodiment is composed of a cooler of aluminum or an aluminum alloy and has a top plate portion 242 to be bonded with the metal layer 213 and a flow passage 244 in which a cooling liquid flows.

The heat sink 241 is bonded to the metal layer 213 (second aluminum layer 213A) of the power module substrate 210 by brazing.

In the power module substrate with a heat sink 240 having the above-described configuration of the embodiment, similar to the first and second embodiments, cracking in the insulating substrate 211, warpage in the power module substrate 210, and the like can be suppressed.

Further, in the embodiment, since the metal layer 213 is composed of the second aluminum layer 213A, the metal layer can be bonded with the heat sink 241 made of aluminum or an aluminum alloy by brazing in a satisfactory manner.

Although the embodiments of the present invention have been described above, the present invention is not limited to the embodiments and may be appropriately modified in various ways within a scope not departing from the technical idea of the invention.

For example, the description has been made of the configuration in which as an aluminum sheet forming the aluminum layer (first aluminum layer and second aluminum layer), a rolled plate of 4N aluminum having a purity of 99.99% by mass or more is used. However, there is no limitation thereto and other aluminum or aluminum alloys may be used. Similarly, the description has been made of the configuration in which as a copper sheet forming the copper layer (first copper layer and second copper layer), a rolled plate of oxygen-free copper is used. However, there is no limitation thereto and other copper or copper alloy may be used.

In addition, the description has been made of the configuration in which as the insulating substrate, a ceramic substrate made of AlN is used. However, there is no limitation thereto and a ceramic substrate made of, for example, $Si_3N_4$, $Al_2O_3$ or the like may be used.

Further, the description has been made of the configuration in which the insulating substrate, the first aluminum layer, and the second aluminum layer are bonded by brazing. However, there is no limitation thereto and for example, a transient liquid phase bonding method, a metal paste method, a metal paste method, a casting method, and the like may be used.

The structure of the heat sink and the like are not limited to the embodiment and for example, a heat-dissipating plate having another structure and a cooler may be used.

The description has been made of the configuration in which the circuit layer 12 includes the first aluminum layer 12A which is formed on one surface of the insulating substrate 11 and the first copper layer 12B which is formed by bonding the first copper sheet 22B to the one side of the first aluminum layer 12A in the power module substrate of the above-described embodiment. However, there is no limitation thereto.

Figure 8:
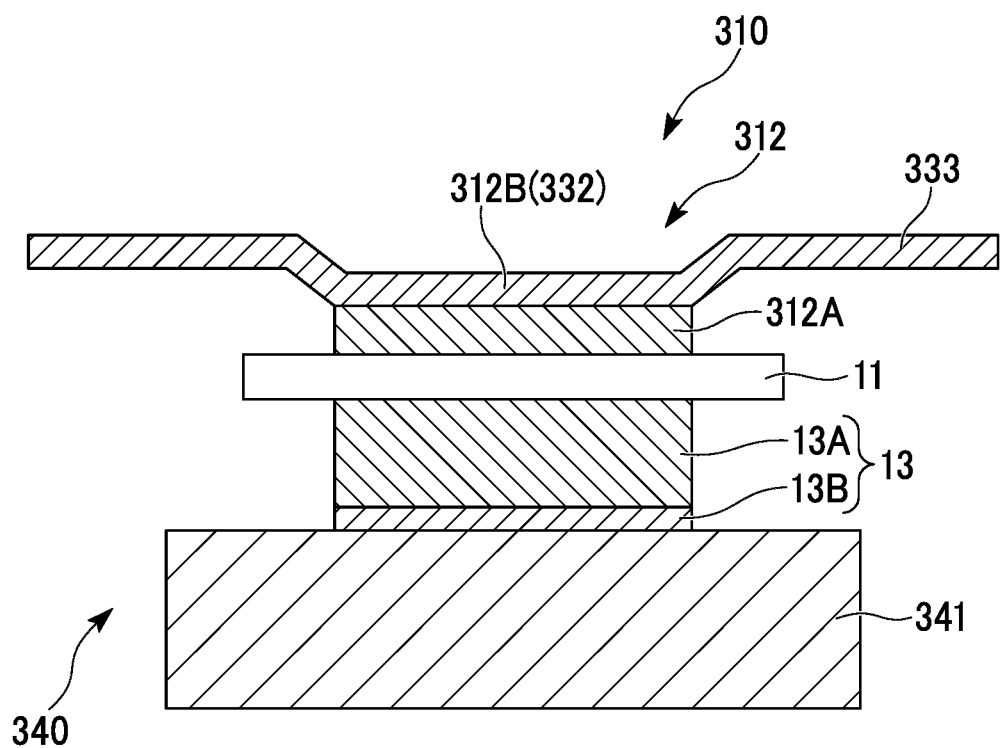
FIG. 8 is a schematic explanatory diagram showing a power module substrate with a heat sink according to another embodiment of the present invention.

For example, as shown in a power module substrate 310 in FIG. 8, a circuit layer 312 includes a first aluminum layer 312A which is formed on one surface of an insulating substrate 11 and a first copper layer 312B which is formed by bonding a copper sheet to one side of the first aluminum layer 312A, and the first copper layer 312B may be composed of a copper sheet having a die pad 332 to which a semiconductor or the like is bonded and a lead portion 333 used as an external terminal. In the power module substrate 310, the die pad 332 and the first aluminum layer 312A are bonded by the solid-phase diffusion. Here, the thickness of the first aluminum layer 312A is preferably set to 0.1 mm or more and 1.0 mm or less. In addition, the thickness of the first copper layer 312B is preferably set to 0.1 mm or more and 6.0 mm or less.

Further, in the power module substrate with a heat sink 340 shown in FIG. 8, a heat sink 341 made of aluminum or an aluminum alloy is bonded to the metal layer 13 of the power module substrate 310 by solid-phase diffusion.

In the embodiment, the description has been made of the embodiment in which the intermetallic compound layer (first intermetallic compound layer 12C and second intermetallic compound layer 13C) is formed at the bonding interface between the aluminum layer (first aluminum layer 12A and second aluminum layer 13A) and the copper layer (first copper layer 12B and second copper layer 13B) and the θ phase 16, the η2 phase 17, and the ζ2 phase 18 are laminated in order from the aluminum layer side (first aluminum layer 12A and second aluminum layer 13A) to the copper layer side (first copper layer 12B and second copper layer 13B). However, there is no limitation thereto.

Specifically, an intermetallic compound layer made of a plurality of intermetallic compounds of Cu and Al may be laminated such that the ratio of the aluminum decreases at the interface between the aluminum layer (first aluminum layer and second aluminum layer) and the copper layer (first copper layer and second copper layer) in order from the aluminum layer (first aluminum layer and second aluminum layer) to the copper layer (first copper layer and second copper layer).

Figure 9:
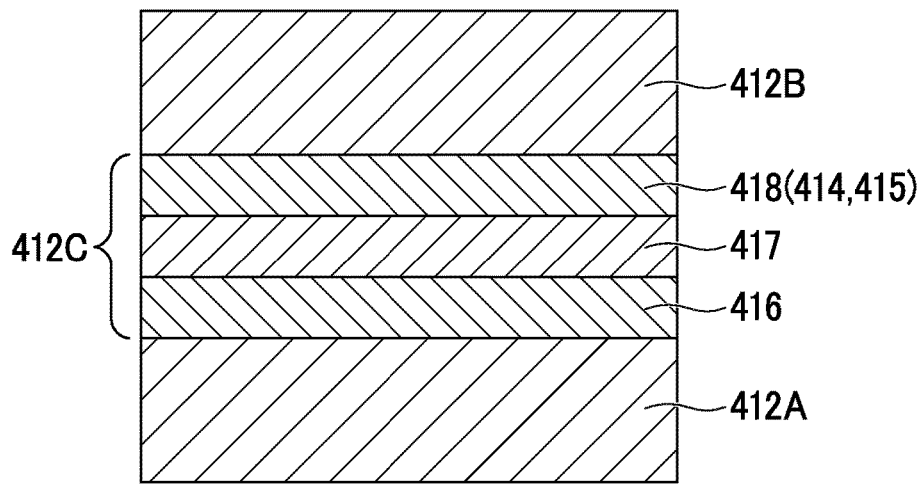
FIG. 9 is a schematic explanatory diagram showing a bonding interface between a first aluminum layer and a first copper layer in the power module substrate with a heat sink according to another embodiment of the present invention.
Figure 10:
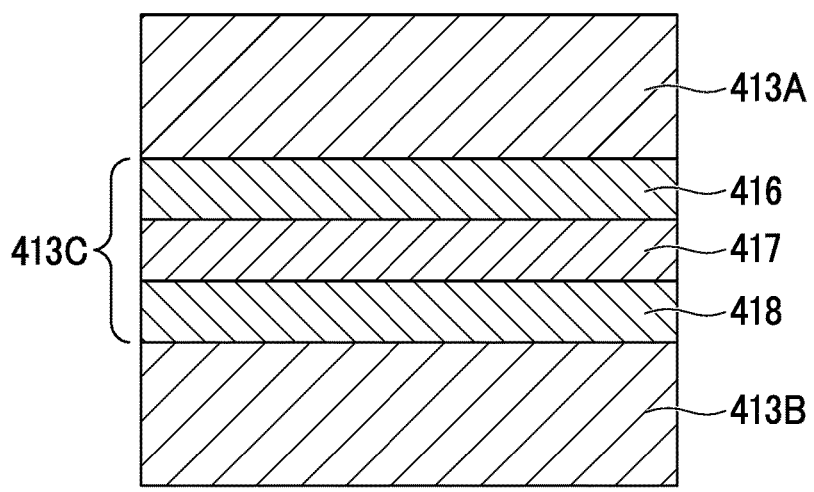
FIG. 10 is a schematic explanatory diagram showing a bonding interface between a second aluminum layer and a second copper layer in the power module substrate with a heat sink according to another embodiment of the present invention.

As shown in FIGS. 9 and 10, at the interface between an aluminum layer (first aluminum layer 412A and second aluminum layer 413A) and a copper layer (first copper layer 412B and second copper layer 413B), an intermetallic compound layer (first intermetallic compound layer 412C and second intermetallic compound layer 413C) in which a θ 416 and a η2 phase 417 are laminated in order from the aluminum layer (first aluminum layer 412A and second aluminum layer 413A) to the copper layer (first copper layer 412B and second copper layer 413B) along the bonding interface and further at least one of a ζ2 phase 418, a δ phase 414, and a γ2 phase 415 is laminated may be provided (refer to FIG. 13).

Figure 11:
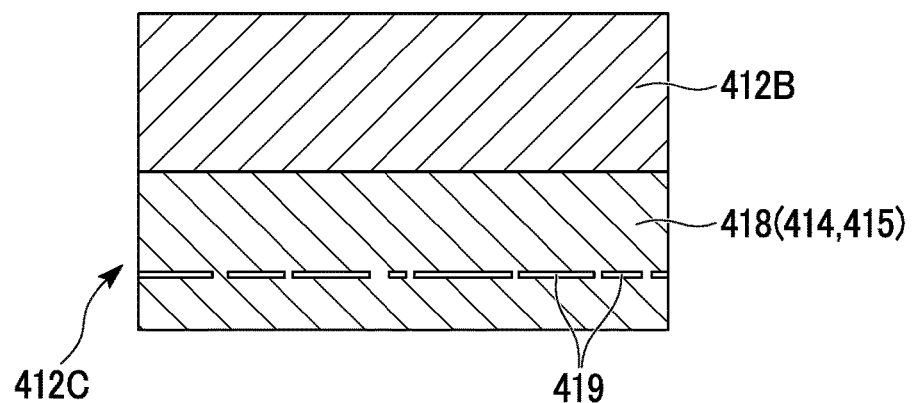
FIG. 11 is an enlarged explanatory diagram showing the interface between the first intermetallic compound layer and the first copper layer in FIG. 9.
Figure 12:
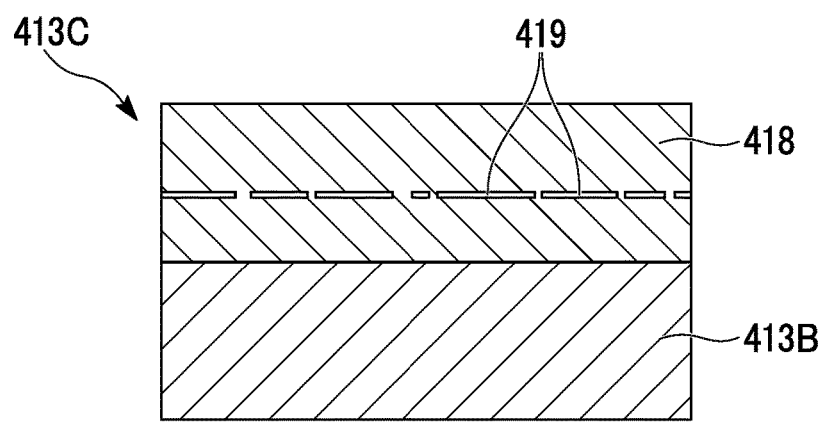
FIG. 12 is an enlarged explanatory diagram showing the interface between the second intermetallic compound layer and the second copper layer in FIG. 10.

In the embodiment, the description has been made of the case in which at the interface between the intermetallic compound layer (first intermetallic compound layer 12C and second intermetallic compound layer 13C) and the copper layer (first copper layer 12B and second copper layer 13B), the oxides 19 are dispersed along the bonding interface in the form of a layer. For example, as shown in FIGS. 11 and 12, along the interface between the intermetallic compound layer (first intermetallic compound layer 412C and second intermetallic compound layer 413C) and the copper layer (first copper layer 412B and second copper layer 413B), oxides 419 may be dispersed along the bonding interface in the form of a layer in the ζ2 phase 418, the δ phase 414, and the γ2 phase 415. The oxide 419 is an aluminum oxide such as alumina ($Al_2O_3$).

EXAMPLES

Example 1

Description will be made with respect to comparative experiments that were carried out to confirm the effectiveness of the present invention.

As shown in Table 1, each power module substrate was prepared by bonding an insulating substrate, an aluminum sheet which becomes a first aluminum layer of a circuit layer, a copper sheet which becomes a first copper layer, an aluminum sheet which becomes a second aluminum layer of a metal layer, and a copper sheet which becomes a second copper layer.

The size of the circuit layer was set to 37 mm×37 mm, the size of the insulating substrate was set to 40 mm×40 mm, and the size of the metal layer was set to 37 mm×37 mm.

In Table 2, the term "TLP" refers to the aluminum sheet and the insulating substrate being bonded by fixing Cu to the surface of the insulating substrate in an amount of 1.0 mg/cm² and heating the laminated body in a vacuum of $10^{-3}$ Pa at 600° C. for 30 minutes while compressing the laminated body at a pressure of 5 kgf/cm² in a lamination direction.

In Table 2, the term "Al—Si brazing" refers to the aluminum sheet and the insulating substrate being bonded by heating the laminated body in a vacuum of $10^{-3}$ Pa at 650° C. for 30 minutes while compressing the laminated body at a pressure of 12 kgf/cm² in a lamination direction using a brazing foil (having a thickness of 100 μm) composed of Al-7.5% by mass Si.

In Table 2, the term "active metal brazing" refers to the copper sheet and the insulating substrate being bonded by heating the laminated body in a vacuum of $10^{-3}$ Pa at 850° C. for 10 minutes using an active brazing material composed of Ag-27.4% by mass Cu-2.0% by mass Ti.

In Table 2, the term "DBC" refers to the copper sheet and the insulating substrate being bonded by heating the laminated body in a nitrogen gas atmosphere at 1,075° C. for 10 minutes.

The first copper layer and the first aluminum layer and the second copper layer and the second aluminum layer were bonded by solid-phase diffusion using a vacuum furnace under the conditions of a furnace pressure of $3×10^{-3}$ Pa, a heating temperature of 535° C., a holding time of 60 minutes, and an applied pressure of 12 kgf/cm² (1.17 MPa).

A heat sink was bonded to the other surface side of the metal layer of the aforementioned power module substrate. The heat sink was composed of an aluminum sheet (60 mm×70 mm×5 mm) of an A3003 alloy.

In the power module substrate having the metal layer composed of only the second aluminum layer, bonding was performed by heating the laminated body at 610° C. in a vacuum while compressing the laminated body at 3.0 kgf/cm² using an Al—Si brazing foil.

In the power module substrate having the metal layer composed of the second aluminum layer and the second copper layer, at the time of the aforementioned solid-phase diffusion bonding, the heat sink and the second copper layer were bonded by solid-phase diffusion.

The power module substrates with a heat sink obtained in the above-described manner were used to perform a thermal cycle test. The evaluation results are shown in Table 2. Each power module substrate was observed every 500 cycles and the evaluation was performed based on the number of cycles at the time when cracking in the insulating substrate was confirmed. The measurement conditions are as shown below.

Evaluation apparatus: TSB-51 manufactured by ESPEC CORP.

Liquid phase: Fluorinert

Temperature condition: −40° C.×5 minutes and 125° C.×5 minutes

Further, an IGBT element was bonded to one surface side of the circuit layer in each of these power module substrates. Solder bonding was performed using a Sn—Ag—Cu-based solder material in a hydrogen reduction atmosphere at 300° C.

The power modules obtained in the above-described manner were used to perform a power cycle test. The evacuation results are shown in Table 2. Evaluation was made for a rate of increase in heat resistance after the power cycle was loaded 100,000 times.

The heat resistance increase rate was measured by the following manner. The IGBT element was heated by applying a current to the IGBT and the temperature of the IGBT element was measured by using a temperature sense diode in the IGBT element. In addition, the temperature of a cooling medium (ethylene glycol:water=9:1) flowing in the heat sink was measured. Then, a value standardized by the difference in temperature between the IGBT and the cooling medium was set as a heat resistance increase rate. The measurement conditions are as shown below.
Temperature difference: 80° C.
Temperature range: 55° C. to 135° C. (measured by the temperature sense diode in the IGBT element)
Conduction duration: 6 seconds
Cooling time: 4 seconds result of the thermal cycle test was satisfactory. However, in the power cycle test, it was confirmed that heat resistance was significantly increased.

In Comparative Examples 5 and 6 in which the circuit layer was composed of only the first copper layer, in the thermal cycle test, at 1,000 or less cycles, cracking in the insulating substrate was observed.

TABLE 1

| | | Circuit layer | | | | Metal layer | | | | Insulating substrate | |
|---|---|---|---|---|---|---|---|---|---|---|---|
| | | First copper layer | | First aluminum layer | | Thickness $t_1$ of circuit layer | Second copper layer | | Second aluminum layer | | | |
| | | Material | Thickness | Material | Thickness | | Material | Thickness | Material | Thickness $t_2$ | ratio $t_2/t_1$ | Material | Thickness |
| Example | 1 | OFC | 0.2 mm | 4N—Al | 0.3 mm | 0.5 mm | OFC | 0.1 mm | 4N—Al | 0.9 mm | 1.80 | AlN | 0.635 mm |
| | 2 | Tough pitch | 1.5 mm | Al050 | 0.2 mm | 1.7 mm | OFC | 0.2 mm | Al050 | 3.4 mm | 2.00 | $Si_3N_4$ | 0.32 mm |
| | 3 | OFC | 1.3 mm | Al100 | 0.5 mm | 1.8 mm | OFC | 0.1 mm | Al100 | 2.88 mm | 1.60 | $Al_2O_3$ | 0.32 mm |
| | 4 | OFC | 0.1 mm | Al050 | 0.3 mm | 0.4 mm | OFC | 0.3 mm | Al080 | 1.2 mm | 3.00 | $Si_3N_4$ | 0.32 mm |
| | 5 | Tough pitch | 0.15 mm | 4N—Al | 0.2 mm | 0.35 mm | OFC | 0.5 mm | 4N—Al | 0.7 mm | 2.00 | AlN | 0.635 mm |
| | 6 | OFC | 0.25 mm | Al050 | 0.1 mm | 0.35 mm | OFC | 0.1 mm | Al050 | 2.1 mm | 6.00 | AlN | 0.635 mm |
| | 7 | OFC | 0.3 mm | 4N—Al | 0.5 mm | 0.8 mm | — | — | 4N—Al | 2.4 mm | 3.00 | AlN | 0.635 mm |
| | 8 | OFC | 2.0 mm | 4N—Al | 0.4 mm | 2.4 mm | — | — | 4N—Al | 4.8 mm | 2.00 | AlN | 0.635 mm |
| Comparative Example | 1 | OFC | 0.2 mm | 4N—Al | 0.1 mm | 0.3 mm | OFC | 0.2 mm | 4N—Al | 0.2 mm | 0.67 | AlN | 0.635 mm |
| | 2 | OFC | 0.3 mm | 4N—Al | 0.1 mm | 0.4 mm | OFC | 0.1 mm | Al050 | 0.4 mm | 1.00 | AlN | 0.635 mm |
| | 3 | — | — | 4N—Al | 0.6 mm | 0.6 mm | — | — | 4N—Al | 1.5 mm | 2.50 | AlN | 0.635 mm |
| | 4 | — | — | 4N—Al | 0.4 mm | 0.4 mm | OFC | 0.1 mm | 4N—Al | 1.4 mm | 3.50 | AlN | 0.635 mm |
| | 5 | Tough pitch | 1.0 mm | — | — | 1.0 mm | — | — | 4N—Al | 0.5 mm | 0.50 | AlN | 0.635 mm |
| | 6 | OFC | 0.3 mm | — | — | 0.3 mm | OFC | 0.2 mm | 4N—Al | 0.24 mm | 0.80 | AlN | 0.635 mm |

TABLE 2

| | | Bonding method of circuit layer and insulating substrate | Bonding method of metal layer and insulating substrate | Thermal cycle | Power cycle |
|---|---|---|---|---|---|
| Example | 1 | Al-Si brazing | Al-Si brazing | >5,000 | 1.2% |
| | 2 | TLP | TLP | >3,000 | 2.3% |
| | 3 | TLP | TLP | >4,000 | 1.8% |
| | 4 | TLP | TLP | >5,000 | 2.9% |
| | 5 | Al-Si brazing | Al-Si brazing | >6,000 | 4.2% |
| | 6 | Al-Si brazing | Al-Si brazing | >6,000 | 1.6% |
| | 7 | Al-Si brazing | Al-Si brazing | >5,000 | 2.3% |
| | 8 | TLP | TLP | >4,000 | 1.5% |
| Comparative Example | 1 | Al-Si brazing | Al-Si brazing | >2,000 | 2.6% |
| | 2 | Al-Si brazing | TLP | >2,000 | 2.3% |
| | 3 | Al-Si brazing | Al-Si brazing | >6,000 | 11.3% |
| | 4 | Al-Si brazing | TLP | >4,000 | 12.3% |
| | 5 | DBC | Al-Si brazing | <1,000 | 1.1% |
| | 6 | Active metal brazing | Al-Si brazing | >1,000 | 1.2% |

In Comparative Example 1 in which the thickness $t_1$ of the circuit layer was smaller than the thickness $t_2$ of the second aluminum layer of the metal layer, in the thermal cycle test, cracking in the insulating substrate was observed at 3,000 or less cycles. Further, also in the power cycle test, an increase in heat resistance was observed.

In Comparative Example 2 in which the thickness $t_1$ of the circuit layer was equal to the thickness $t_2$ of the second aluminum layer of the metal layer, in the thermal cycle test, cracking in the insulating substrate was observed at 2,000 or less cycles. Further, also in the power cycle test, an increase in heat resistance was observed.

In Comparative Examples 3 and 4 in which the circuit layer was composed of only the first aluminum layer, the In contrast, in Examples 1 to 8, in the thermal cycle test, at 3,000 or more cycles, cracking in the insulating substrate was not observed. In addition, also in the power cycle test, it was confirmed that an increase in heat resistance was suppressed.

From the above results, according to Examples, it was confirmed that it was possible to provide a power module substrate capable of facilitating dissipation of heat from a heat-generating body such as an electrical component which is mounted on the circuit layer, suppressing cracking occurring in the insulating substrate during loading of a thermal cycle while achieving excellent power cycle properties, and achieving high reliability, a power module substrate with a heat sink, and a power module.

Example 2

Next, as shown in the aforementioned second embodiment and FIG. 6, the metal layer of the power module substrate and the heat sink were bonded through the second solder layer to evaluate the bonding rate of the second solder layer.

As shown in Table 3, each power module substrate was prepared by bonding an insulating substrate, an aluminum sheet which becomes a first aluminum layer of a circuit layer, a copper sheet which becomes a first copper layer, an aluminum sheet which becomes a second aluminum layer of a metal layer, and a copper sheet which becomes a second copper layer.

The size of the circuit layer was set to 37 mm×37 mm, the size of the insulating substrate was set to 40 mm×40 mm, and the size of the metal layer was set to 37 mm×37 mm.

The terms "TLP" and "Al—Si brazing" shown in Table 4 refer to the same bonding methods as in the aforementioned Examples 1 and 2.

A heat sink was bonded to the other surface side of the metal layer of the aforementioned power module substrate through a solder material. As the heat sink, as in the aforementioned Example 1, an aluminum sheet of an A3003 alloy (60 mm×70 mm×5 mm) was used.

Using a Sn—Sb-based solder material, soldering was performed such that the laminated body was held in a hydrogen gas atmosphere at 200° C. for 5 minutes and then held at 300° C. for 10 minutes. Thereafter, the atmosphere was substituted with a nitrogen atmosphere and cooling was performed. Thus, the heat sink was bonded to the metal layer. A Ni plating film was formed on the bonding surface of the heat sink, and then soldering was performed. Further, in Comparative Example 11, a Ni plating film was also formed on the bonding surface of the metal layer and then soldering was performed.

The power module substrates with a heat sink obtained in the above-described manner were used to perform a thermal cycle test. The thermal cycle conditions were set as in the aforementioned Example 1 and 3,000 times of thermal cycles were loaded.

Then, the bonding rate of the second solder layer was measured respectively at the initial bonding and after 3,000 times of thermal cycles were loaded. The evaluation results are shown in Table 4.

INDUSTRIAL APPLICABILITY

According to the present invention, dissipation of heat from a heat-generating body such as an electrical component which is mounted on a circuit layer can be facilitated, cracking occurring in the insulating substrate can be suppressed during loading of a thermal cycle while achieving excellent power cycle properties, and high reliability can be achieved. Accordingly, the present invention is industrially applicable.

REFERENCE SIGNS LIST 1, 101, 201: POWER MODULE
3: SEMICONDUCTOR ELEMENT (ELECTRICAL COMPONENT)
10, 110, 210, 310: POWER MODULE SUBSTRATE
11, 111, 211: INSULATING SUBSTRATE
12, 112, 212, 312: CIRCUIT LAYER
12A, 112A, 212A, 312A: FIRST ALUMINUM LAYER
12B, 112B, 212B, 312B: FIRST COPPER LAYER
13, 113, 213: METAL LAYER
13A, 113A, 213A: SECOND ALUMINUM LAYER
13B, 113B: SECOND COPPER LAYER

TABLE 3

| | Circuit layer | | | | Metal layer | | | | Insulating layer | |
| | First copper layer | | First aluminum layer | | Thickness $t_1$ of circuit layer | Second copper layer | | Second aluminum layer | | Thickness ratio $t_2/t_1$ | | |
| | Material | Thickness | Material | Thickness | | Material | Thickness | Material | Thickness $t_2$ | | Material | Thickness |
|---|---|---|---|---|---|---|---|---|---|---|---|---|
| Example 11 | OFC | 0.3 mm | 4N—Al | 0.1 mm | 0.4 mm | OFC | 0.1 mm | 4N—Al | 0.8 mm | 2.00 | AlN | 0.635 mm |
| Example 12 | OFC | 0.2 mm | Al050 | 0.2 mm | 0.4 mm | OFC | 0.1 mm | Al100 | 1.2 mm | 3.00 | $Si_3N_4$ | 0.32 mm |
| Example 13 | Tough pitch | 1.0 mm | 4N—Al | 0.3 mm | 1.3 mm | Tough pitch | 0.2 mm | Al050 | 1.95 mm | 1.50 | $Al_2O_3$ | 0.38 mm |
| Example 14 | OFC | 0.3 mm | Al100 | 0.2 mm | 0.5 mm | OFC | 0.15 mm | 4N—Al | 2.0 mm | 4.00 | AlN | 0.5 mm |
| Comparative Example 11 | — | — | 4N—Al | 0.6 mm | 0.6 mm | — | — | 4N—Al | 0.9 mm | 1.50 | AlN | 0.635 mm |

TABLE 4

| | Bonding method of circuit layer and insulating substrate | Bonding method of metal layer and insulating substrate | Bonding rate of second solder layer (%) | |
|---|---|---|---|---|
| | | | Initial bonding | After thermal cycle |
| Example 11 | Al-Si brazing | Al-Si brazing | 98.2 | 90.3 |
| Example 12 | TLP | TLP | 97.6 | 89.2 |
| Example 13 | Al-Si brazing | TLP | 99.7 | 84.3 |
| Example 14 | TLP | Al-Si brazing | 99.4 | 87.5 |
| Comparative Example 11 | Al-Si brazing | Al-Si brazing | 98.6 | 56.2 |

In Comparative Example 11 in which the circuit layer and the metal layer were composed of an aluminum sheet, after the thermal cycle was loaded, the bonding rate was significantly decreased. It is assumed that this is because cracks are initiated in the second solder layer by the thermal cycle.

In contrast, in Examples 11 to 14, even after the thermal cycle was loaded, the bonding rate was not significantly decreased. According to Examples 11 to 14, it was confirmed that crack initiation in the second solder layer could be suppressed.

40, 140, 240, 340: POWER MODULE SUBSTRATE WITH HEAT SINK
41, 141, 241, 341: HEAT SINK

The invention claimed is:
1. A power module substrate comprising:
an insulating substrate;
a circuit layer which is formed on one surface of the insulating substrate; and
a metal layer which is formed on the other surface of the insulating substrate,
wherein the circuit layer has a first aluminum layer made of aluminum or an aluminum alloy which is bonded on one surface of the insulating substrate and a first copper layer made of copper or a copper alloy which is bonded on a surface of the first aluminum layer located on the side opposite to the insulating substrate by solid-phase diffusion,
the metal layer has a second aluminum layer made of aluminum or an aluminum alloy, and
a relationship between a thickness $t_1$ of the circuit layer and a thickness $t_2$ of the second aluminum layer of the metal layer satisfy $t_1 < t_2$.

2. A power module substrate with a heat sink comprising:
the power module substrate according to claim 1; and
a heat sink which is bonded to the metal layer side.

3. A power module comprising:
the power module substrate according to claim 1; and
an electrical component which is mounted on the circuit layer.

4. The power module substrate according to claim 1, wherein the relationship between thickness $t_1$ of the circuit layer and the thickness $t_2$ of the second aluminum layer of the metal layer satisfy $t_2/t_1 \geq 1.5$.

5. A power module substrate with a heat sink comprising:
the power module substrate according to claim 4; and
a heat sink which is bonded to the metal layer side.

6. A power module comprising:
the power module substrate according to claim 4; and
an electrical component which is mounted on the circuit layer.

7. The power module substrate according to claim 1, wherein the metal layer has the second aluminum layer which is bonded on the other surface of the insulating substrate and a second copper layer made of copper or a copper alloy which is bonded on a surface of the second aluminum layer located on the side opposite to the insulating substrate by solid-phase diffusion.

8. A power module substrate with a heat sink comprising:
the power module substrate according to claim 7; and
a heat sink which is bonded to the metal layer side.

9. A power module comprising:
the power module substrate according to claim 7; and
an electrical component which is mounted on the circuit layer.

10. The power module substrate according to claim 7, wherein the relationship between thickness $t_1$ of the circuit layer and the thickness $t_2$ of the second aluminum layer of the metal layer satisfy $t_2/t_1 \geq 1.5$.

11. A power module substrate with a heat sink comprising:
the power module substrate according to claim 10; and
a heat sink which is bonded to the metal layer side.

12. A power module comprising:
the power module substrate according to claim 10; and
an electrical component which is mounted on the circuit layer.

* * * * *